(12) United States Patent
Shimomura et al.

(10) Patent No.: US 6,869,541 B2
(45) Date of Patent: Mar. 22, 2005

(54) EPOXY RESIN COMPOSITION, SURFACE TREATING METHOD, INK-JET RECORDING HEAD, AND INK-JET RECORDING APPARATUS

(75) Inventors: Akihiko Shimomura, Kanagawa (JP); Hiromichi Noguchi, Tokyo (JP); Isao Imamura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 72 days.

(21) Appl. No.: 10/369,543

(22) Filed: Feb. 21, 2003

(65) Prior Publication Data

US 2003/0185996 A1 Oct. 2, 2003

(30) Foreign Application Priority Data

Feb. 21, 2002 (JP) ........................................ 2002-045280

(51) Int. Cl.$^7$ .............................................. G01O 15/00
(52) U.S. Cl. .................... 216/27; 427/272; 427/468; 427/487; 427/489; 427/490; 427/496; 427/503; 526/204; 526/217; 526/242; 526/245; 526/266; 526/268; 526/273; 526/279; 526/324; 526/325; 526/346
(58) Field of Search ................................ 526/204, 217, 526/242, 245, 266, 268, 273, 279, 324, 346, 126, 219.1, 250, 255; 528/402, 408, 421; 427/372.2; 430/280.1, 320; 549/545, 551, 554, 563; 556/437, 445, 450, 465

(56) References Cited

U.S. PATENT DOCUMENTS

| | | | |
|---|---|---|---|
| 4,688,052 A | 8/1987 | Inamoto et al. | 346/140 |
| 4,688,053 A | 8/1987 | Noguchi et al. | 346/140 |
| 4,839,668 A | 6/1989 | Sato et al. | 346/140 |
| 4,839,669 A | 6/1989 | Sato et al. | 346/140 |
| 4,970,532 A | 11/1990 | Komuro et al. | 346/140 |
| 5,086,307 A | 2/1992 | Noguchi et al. | 346/140 |
| 5,196,558 A * | 3/1993 | Inomata et al. | 556/434 |
| 5,451,992 A | 9/1995 | Shimomura et al. | 347/45 |
| 5,612,433 A * | 3/1997 | Ono et al. | 526/279 |
| 5,650,805 A | 7/1997 | Shimomura et al. | 347/20 |
| 5,663,752 A | 9/1997 | Imamura et al. | 347/65 |
| 5,738,911 A | 4/1998 | Imamura et al. | 427/387 |
| 5,770,271 A | 6/1998 | Imamura | 427/412.1 |
| 5,980,026 A | 11/1999 | Imamura et al. | 347/65 |
| 6,291,545 B2 | 9/2001 | Imamura | 522/181 |
| 6,484,399 B2 | 11/2002 | Aono et al. | 29/890.1 |
| 2003/0025760 A1 | 2/2003 | Imamura et al. | 347/45 |
| 2003/0114583 A1 * | 6/2003 | Stark et al. | 524/588 |

FOREIGN PATENT DOCUMENTS

JP  2-39944  2/1990

OTHER PUBLICATIONS

Handbook of Epoxy Resins, Lee and Neville, 1967,pp. 10–14 through 10–16.*

* cited by examiner

Primary Examiner—Margaret G. Moore
Assistant Examiner—Marc S Zimmer
(74) Attorney, Agent, or Firm—Fitzpatrick, Cella, Harper & Scinto (57) ABSTRACT

An epoxy resin composition suitable for forming a film of excellent water repellency which comprises an epoxy resin having one or more water repellent groups and two or more cyclic aliphatic epoxy groups per molecule, a triazine-base catalyst for cationic polymerization and a non-polar solvent.

9 Claims, 4 Drawing Sheets

EPOXY RESIN COMPOSITION, SURFACE TREATING METHOD, INK-JET RECORDING HEAD, AND INK-JET RECORDING APPARATUS

BACKGROUND OF THE INVENTION

1. Field of the Invention

This invention relates to a curable epoxy resin composition which can be used for treating the surface of an object to impart repellency to water or ink thereto, in particular, an epoxy resin composition which can form a patterned film by ultraviolet light irradiation and can form a cured film part of which can be selectively removed by using excimer laser etc. The present invention also relates a method for treating the surface of a base material using the above composition, an ink-jet recording head subjected to ink repellent treatment using the above composition and an ink-jet apparatus using the above recording head.

2. Related Background Art

In various fields, it is well known to provide a water repellent coating to a member requiring water resistance or ink repellency to impart such properties thereto, and resin materials and coatings for such applications have been developed.

For example, films made of a fluorine-base coating having a perfluoro group or fluoroolefin are extremely stable thermally and chemically, have excellent resistance to weather, water, chemicals and solvents, and in addition, have excellent release properties, abrasion resistance and water repellency. Thus they are widely used in various applications.

On the other hand, in the ink-jet recording head, which ejects minute ink droplets from an ink ejection orifice to attach them on paper etc. for recording or image formation, upgrading has been carried out to achieve higher recording properties with much smaller liquid droplets, higher driving frequency and more nozzles so on. Therefore, treatment to keep the conditions of an orifice plate on which nozzles are facing, is getting important more and more.

However, it is difficult to carry out precise surface treatment selectively or in a pattern to repel ink from the orifice plate with conventional materials. The reason is as follows: to achieve the above purpose, the main component of the treating agent must be a compound having photosensitive functional group so that the treating agent can have photoresist properties, and it is difficult to design a compound to have both photosensitive functional groups and water and ink repellency.

Even if the orifice plate could be treated with a conventional fluorine base material, it is still necessary to design a film structure to keep the surface properties for a long time. Accordingly, a material that has the above-described performance and patternable properties will be extremely valuable in surface treatment of ink-jet recording heads.

In the ink-jet recording system where recording is performed by ejecting ink as ink droplets, a preferable ink ejection orifice (opening) of a nozzle is designed so that:

(1) after ink ejection, the remaining ink in the ink column can be swiftly stored in the nozzle;

(2) ink droplets attached to the surface of the orifice plate can be wiped off easily by cleaning operation;

(3) the surface of the orifice plate can be resistant to abrasion due to cleaning operation to wipe the ink attached to the surface or due to paper conveyance;

(4) the meniscus can be always formed at the nozzle orifice (refer to FIG. 1, reference numeral 23) in the repeated droplet formation and ink re-fill;

(5) ink can be ejected in a direction normal to the meniscus;

(6) the nozzle has an interfacial tension or contact angle that allows meniscus formation even with an ink having a low surface tension or under a slightly negative pressure state.

The reason why such performance is required for the ink ejection orifice is that the printing performance is directly related to the attachment of ink to the vicinity of the orifice because if a recording liquid such as ink is attached in the vicinity of the liquid ejection orifice, the flying direction of the ejected liquid droplet deviates from the desired direction impairing high precision printing. One of the means for preventing liquid attachment to the area surrounding the liquid ejection orifice that causes the above-described deviation in the direction of ejection is to treat the orifice plate with a water repellant. For example, it is known a method in which ink repellent treatment is performed using a polymer having fluoroacetyl group and silazane group (Japanese Patent Application Laid-Open No. 2-39944).

On the other hand, with increasing demands for higher-quality image recording by a printer using a liquid-jet recording system, more improved properties are required for the recording liquid. Accordingly, pH of the recording liquid is often adjusted to 7 to 11 in order to improve the solubility or dispersion stability of the components. Thus, it is desired to employ structural materials having resistance to alkali and hydrolysis for printer members.

SUMMARY OF THE INVENTION

However, when a recording liquid containing a polar organic solvent or a recording liquid of a high pH is used, the film of a water repellent applied to the surface of the orifice plate may be peeled off because the contact with the solvent component of the recording liquid, especially with a polar organic solvent, may deteriorate the film forming ability or adhesion to the applied member, leading to loss of water repellence of the liquid ejection orifice face.

Accordingly, an object of this invention is to provide an epoxy resin composition usable as a water repelling agent or a water repelling coating agent that is applicable to a region which may contact a solution or substance containing a component such as polar organic solvents which will impair the film forming properties and adhesiveness of ordinary water repelling agents, and that form a water repelling film excellent in adhesiveness onto the surface of an object even at a relatively low temperature.

Another object of this invention is to provide a surface treating method to impart water repellency to the surface of an object site-selectively using the above epoxy resin composition.

Still another object of this invention is to provide an ink-jet recording head and an ink-jet recording apparatus, of which nozzle surface is coated with the above epoxy resin composition to maintain the surface to the same conditions and free from ink attachment even after the long-term contact with the recording medium, whereby high dot-landing accuracy and high print quality can be maintained for a long time.

The above objects are accomplished by the invention described below.

According to one embodiment of this invention, there is provided an epoxy resin composition which comprises an epoxy resin having one or more water repellent groups and two or more cyclic aliphatic epoxy groups per molecule, a triazine-base catalyst for cationic polymerization and a non-polar solvent.

According to another embodiment of this invention, there is provided a method for selectively treating the surface of an object comprising the steps of:

(i) forming a film of the above epoxy resin composition on the surface of an object;

(ii) irradiating the above film with activation energy rays through a mask in the pattern generating manner; and (iii) dissolving and removing the portion of the film not exposed to the activation energy rays using a liquid capable of dissolving such a portion.

According to another embodiment of this invention, there is provided a method for selectively treating the surface of an object, comprising the steps of:

(i) forming a film of the above epoxy resin composition on the surface of an object;

(ii) setting the film by polymerization; and (iii) selectively removing the above film.

According to still another embodiment of this invention, there is provided an ink-jet recording head having an ejection orifice for ejecting liquid therethrough, characterized in that at least the area surrounding the opening of the ejection orifice is coated with the cured film of the above epoxy resin composition.

According to still another embodiment of this invention, there is provided an ink-jet recording apparatus, characterized in that it includes the above ink-jet recording head.

Since the resin composition of this invention is based on an epoxy resin, the film formed with the composition has the following advantages: excellent adhesion to various materials, curing at a relatively low temperatures, and excellent physical properties as a structural member. Further, since the resin composition of this invention comprises an epoxy compound having a water repellent group such as alkylsiloxane group or fluoroalkyl group, the resistance to water-soluble organic solvents, in particular, polar organic solvents, of the above film is significantly improved. Further, addition of a compatibilizing agent to the resin composition endows the components with compatibility to widen the range of usable components for the composition.

The film formed by applying the epoxy resin composition of this invention and dried can be pattern-selectively cured since it includes as a catalyst a triazine-base photo-acid-generator that is activated by high energy rays. And since the epoxy resin composition is soluble in a non-polar solvent, a coating liquid containing the above epoxy resin composition can be prepared with a non-polar solvent. Thus, when the coating liquid of the epoxy resin composition is applied to a base material, corrosion of the base material due to the polar solvent will not occur.

Surface treatment in a pattern can be carried out as follows: first a film is formed on the surface of a base material by applying the epoxy resin composition and dried, then the film is irradiated by high energy rays through a mask having a desired pattern; and removing the uncured portion of the film by using a developing solution. Although this pattern treatment is basically the same as that of photolithography, the developing solution must be chosen from solvents or solvent compositions suitable for the film of the epoxy resin composition of the invention. As the developing solution, aromatic hydrocarbons, ketones, esters, glycol ethers, or the mixture thereof can be used.

When surface treatment in a pattern is carried out using the epoxy resin composition of the invention, to ensure the complete curing of the film of the above epoxy resin composition, it is desirable to carry out so-called "postcure" by heating the film or irradiating it with energy rays after the development.

As described above, the epoxy resin composition of this invention is suitably used as a water repelling agent or a water repelling coating agent that is applicable to a region which may contact a solution or substance containing a component such as polar organic solvents which will impair the film adhesiveness of ordinary water repelling agents, and also suitably used for the water or ink repellent treatment of the ink ejection orifice face of ink-jet recording heads.

In other words, the effects of applying the epoxy resin composition of this invention to an ink-jet recording apparatus such as selective surface modification utilizing photo-polymerizability of the resin, the precision of treatment, the solid strength and abrasion resistance of a cured film, the durability of the apparatus as a device, and the high water and ink repellency lead to the improvement in various properties including the meniscus-keeping keeping ability of a water-based ink, cleaning properties, ejection direction accuracy, persistency at continuous ejection and print-restarting property after cessation. The meniscus-keeping ability here means a property of an ink to maintain the ink surface at the tip of the nozzle by its surface tension and to reform and maintain the meniscus at the predetermined position during repeating ejection of liquid droplets. Weak keeping ability leads to inconvenience such that ink oozes from the nozzle tip, the meniscus retreats to decrease the volume of an ink droplet, or, in extreme cases, ink ejection is skipped.

DESCRIPTION OF THE PREFERRED EMBODIMENTS

In the following this invention will be described in further detail in terms of its preferred embodiments. The epoxy resin composition of this invention comprises an epoxy resin having one or more water-repelling groups and two or more cyclic aliphatic epoxy groups per molecule, a triazine-base catalyst for cationic polymerization, and a non-polar solvent.

The epoxy resin as a main component of this epoxy resin composition is not particularly limited so long as it satisfies the above conditions, but the water repellent groups are preferably selected from alkylsiloxane groups and/or fluoroalkyl groups. Generally, the epoxy resins of the following general formula (1) can be used wherein $R_1$, $R_4$ and $R_5$ are independently selected from a hydrogen atom, a methyl group, an ethyl group and a straight- or branched-chain propyl group; $R_2$ and $R_3$ are independently selected from a methyl group or a phenyl group; $x$ is 2 to 100; $n_1$ is an integer of 1 to 3; $n_2$ is an integer of 1 to 5; Rf is a fluoroalkyl group, for example, a fluoroalkyl group with 1 to 3 carbons; a is 1 to 50; b is 2 to 100; c is 1 to 50; and d is 1 to 50.

The epoxy resins of the above general formula (1) can be obtained by copolymerizing (meth)acrylate monomer having an alkylsiloxane group in its side chain, (meth)acrylate monomer having an perfluoroalkyl group, 3,4-oxycyclohexylmethylmethacrylate monomer and styrene in an appropriate monomer ratio by a conventional procedure. Alternatively, those commercially available can also be used. The number average molecular weight of the epoxy resins of the above formula (1) of this invention is preferably 8,000 to 22,000, particularly preferably 8,500 to 20,000 from the viewpoint of the durability of a water repellent film.

One example of the above epoxy resins is an epoxy resin having the following formula (number average molecular weight=10,000) (A-1).

-continued

Rf = $(CF_2)_7CF_3$

The epoxy resin according to the invention may be used alone or formulated with at least one of a solvent and an oligomer of an epoxy resin or other resins having a molecular weight lower than that of the above mentioned epoxy resin. Formulation with the oligomer or the solvent can enhance the application suitability of the epoxy resin composition to the object, and can accelerate drying of the film after the solvent was evaporated, which will enhance workability. It is preferable to use the oligomer as a binder for the epoxy resin composition when a film is formed and exposed to light in a pattern.

Although the epoxy resin composition of this invention is made up mainly of the above epoxy resin and catalyst, it preferably includes a compatibilizing agent depending on the situation. For the compatibilizing agent, the compounds having the following general formula (2) and/or the following general formula (3) are suitable.

(2)

wherein p is an integer of 0 to 2.

A preferable example of the compounds of Formula (2) is a compound of which p=0, that is, 2,2-bis(4-glycidyloxyphenyl)hexafluoropropane.

(3)

wherein q is an integer of 0 to 2,

A preferable example of the compounds of Formula (3) is a compound of which q=0, that is, m-bis-[1-(2,3-epoxypropoxy)-2,2,2-trifluoro-1-(trifluoromethyl)ethyl]benzene.

Although the compounds represented by the above general formula (2) or (3) have alkyl fluoride groups, their effect of lowering the surface energy of the formed film is small due to their short chain length. Thus, the water or ink repellency of the formed film is not high. The compounds having the above general formula (2) and (3) are synthesized conventionally through the reaction of epichlorohydrin and a dihydric alcohol corresponding to a compound of the above general formula (2) and (3) from which the epoxy-dontaining groups are removed from both ends.

The epoxy resin composition of this invention includes a polymerization initiator as a catalyst for cure. In this invention, the epoxy resin composition is designed to be highly reactive with a triazine-base photo-acid-generator which is activated by high energy radiation and enables curing at a low temperature. Such a composition allows selective surface treatment of base materials by photolithography and is suitable for surface modification of the base materials that cannot be held at a high temperature. The catalysts used as above include, for example, (i) 2,4-trichloromethyl-6-(4'-methoxyphenyl)-s-triazine, (ii) 2,4-trichloromethyl-6-(4'-methoxynaphthyl)-s-triazine, (iii) 2,4-trichloromethyl-6-piperonyl-s-triazine, (iv) 2,4-trichloromethyl-6-(4'-methoxystyryl)-s-triazine, and (v) 2,4-trichloromethyl-6-(3'-bromo-4'-methoxyphenyl)-s-triazine. Of these catalysts, (iii) 2,4-trichloromethyl-6-piperonyl-s-triazine is particularly preferable.

To the epoxy resin composition of this invention, a binder polymer other than the above described epoxy resins may be added. When adding a binder polymer, the binder polymer is preferably selected from epoxy polymers having cross-linking ability, such as acrylic resins obtained by copolymerizing acrylic monomers having an epoxy group in their side chains, vinyl polymers obtained by polymerizing vinyl monomers having a cyclic aliphatic epoxy group in their side chains and polyether polymers having a cyclic aliphatic epoxy group in their side chains (e.g. EHPE 3150; by Daicel Chemical Industries, Ltd.). When a polymer not having epoxy group is used as a binder polymer, such a polymer is selected on the basis of physical properties according to the use thereof. Such a polymer material can be polymer compounds for general-purpose paint, such as bisphenol-type epoxy resins (trade names "PKHC", "PKHJ", Union Carbide Co., Ltd.); poly(ethylene/vinyl acetate); phenol resins; polycarbonate resins; polyester resins; polyamide resins; and soluble polyimide resins.

As described so far, the epoxy resin composition of this invention basically includes:

A: an epoxy resin having one or more water repellent groups and two or more cyclic aliphatic epoxy groups;

B: a triazine-base catalyst for cationic polymerization; and, if required,

C: a compatibilizing agent in a non-polar solvent. The preferable blending ratio of these ingredients A, B and C in the epoxy resin composition of this invention is as follows.

When using the ingredient A together with an oligomer, there exists no specific limit to the blending ratio, since the blending ratio depends on the respective softening points and glass transition temperatures. In general, however, the ratio of oligomer:ingredient A=10:90 to 90:10 (part by weight). The amount of the catalyst B is in the range of 0.5 to 6 parts by weight to 100 parts of the total epoxy resin ingredient. The compatibility between the oligomer and the polymer may be poor, so that the use of a compatibilizing agent is often advantageous.

The epoxy resin composition of this invention is used for surface treatment of a base material with heating or irradiation of activation energy rays. Specifically, the epoxy resin composition of this invention dissolved in an aromatic-, aliphatic-, hydrocarbon-, ester-, ether- or fluorine-base solvent can be applied to the surface of a base material using various coating/printing methods such as roll coating, spin coating, spray coating, screen printing and gravure printing. After application, the film of the composition formed on the surface is cured by heating or irradiation of activation energy rays. As a source of the activation energy rays for curing, mercury vapor lamp, laser light, electron rays, etc. can be suitably used to emit rays which include a large amount of bright line spectra in the range of a wavelength of 250 to 450 nm.

The epoxy resin composition of the invention can be formulated to give a dried film, and the film can be patterned as with a photoresist, enabling selective and easy surface treatment of an object. This surface treatment is carried out in the steps of: applying a coating liquid including the epoxy resin composition of this invention to an object; removing the solvent of the coating liquid to give a dried film; superimposing a mask having a proper pattern on the film and irradiating the mask with activation energy rays, or irradiating the film with activation energy in a pattern; and developing with a solvent system that can dissolve the uncured film. If the irradiation of energy rays in a pattern is not sufficient to cure the film, it is desirable to perform post cure after the developing treatment. For post cure, heating treatment including micro wave treatment, and irradiation of activation energy rays such as electron rays and ultraviolet light.

According to the method for surface modification of this invention, water and oil repellency can be provided to an object with excellent film adhesiveness and surface hardness. Accordingly, a great advantage of the present invention is that the base material can be modified to have excellent durability.

One application example of the epoxy resin composition of this invention to an ink-jet recording head is to treat the surface of the orifice plate with the composition to form a surface of good releasing property so that ink would not stick to the surface firmly or ink attached to the surface can be wiped out easily by cleaning treatment.

An ink-jet head can be cleaned by wiping off an ink attached to the orifice plate with a rubber plate, sucking an ink with a pump, or ejecting an ink from the head when the head is placed at the site where recording medium does not exist. However, any such methods cannot completely suppress the attachment of minute ink droplets to the vicinity of the orifice, because when the ink column pushed out by the ejection pressure to be ejected, not all of the ink is ejected. Accordingly, if these minute droplets spontaneously fall off, or are drawn into the nozzle, or removed readily, they would not affect the ink ejection.

The epoxy rein composition of this invention can provide a film that can set at a relatively low temperature, and is excellent in water and oil repellency, adhesion to the base material, chemical resistance and abrasion resistance.

Figure 1:
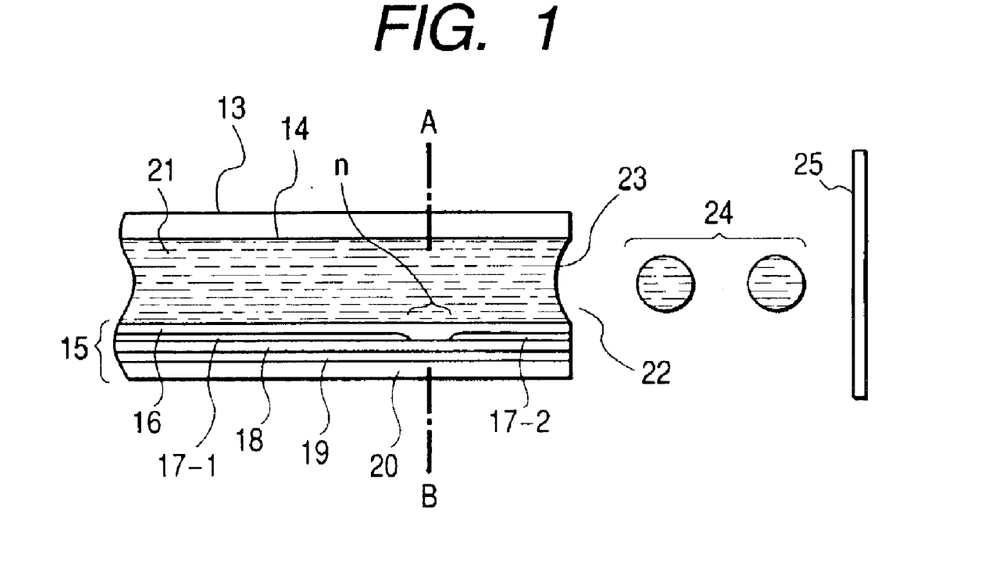
FIG. 1 is a cross sectional view of the main part of an ink-jet recording head, showing one example of ink-jet recording head constructions.
Figure 2:
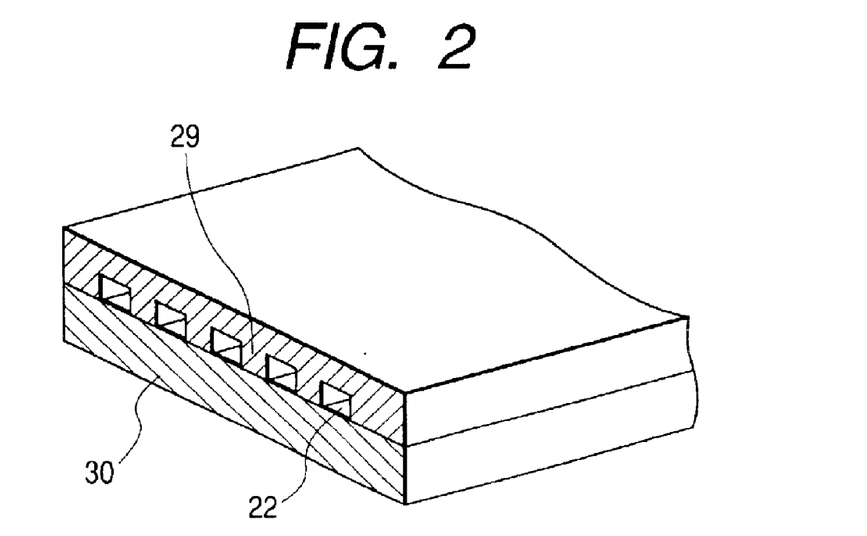
FIG. 2 is a perspective view of the ink-jet recording head of FIG. 1.

FIGS. 1 and 2 schematically show the main part of an ink-jet recording head structure to which the epoxy resin composition of this invention can be applied. FIG. 1 is a cross section taken along the ink flow path, and FIG. 2 is a perspective view of the ink-jet recording head of FIG. 1.

The recording head 13 has a structure where a member having flow paths of a certain pattern formed with a cured product of a thermo- or irradiation setting resin composition is stacked and attached onto a substrate 15 on which means for generating ejection energy has been disposed.

The heat-generating head 15 has a layered structure of a protective layer, electrodes 17-1 and 17-2 made of aluminum or the like, a heat-generating resistor layer 18, a heat-accumulating layer 19, and a substrate 20 made of a heat-radiating material such as alumina, in this order from the surface. Upon application of an electric signal to the electrodes 17-1 and 17-2 as a pulse, the heat generating element formed at the region shown by "n", where the electrode is not covered, rapidly generates heat to apply heat energy to the ink above the element.

On recording, the ink 21 is filled to the ejection orifice 22 being a very small opening at the end of the channel 14, and when current is applied to the electrodes 17-1, 17-2 in response to a recording signal, the heat generating element at "n" generates heat promptly to generate a bubble by film boiling in the ink 21 in contact with the region, and the ink 21 is ejected as a droplet 24 through the orifice 22 by the pressure of the bubble to fly toward a recording medium 25.

In the ink-jet recording head of this invention, a cured film 30 of the epoxy resin composition of this invention is provided as a water/ink repellant at least to the area surrounding the ejection orifice opened in the orifice plate 29 (FIG. 2), to prevent deviation of the ejection direction of ink droplets due to the attachment of the ink to the orifice plate. The cured film of the epoxy resin composition is excellent in adhesion to the orifice plate 29, in addition, its water repellency and adhesiveness would not be impaired even if an ink containing an organic solvent, in particular, a polar organic solvent, is used.

Figure 3:
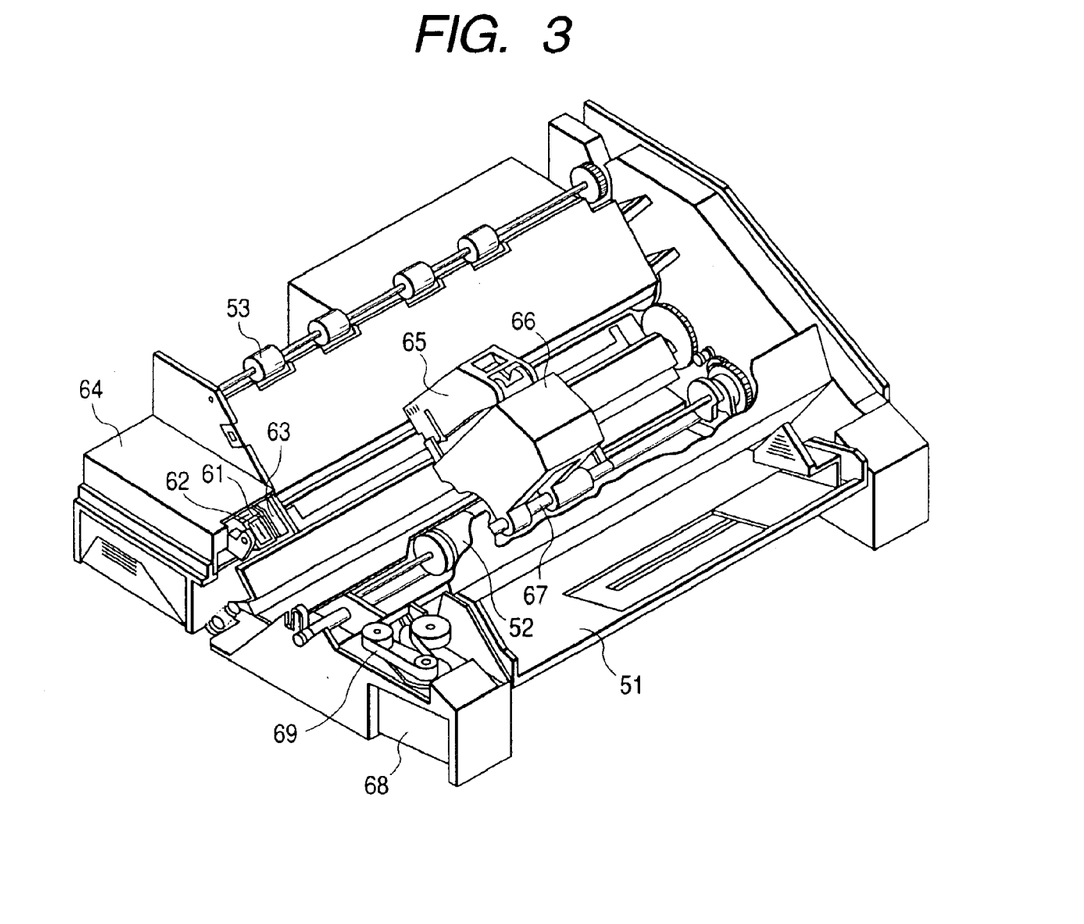
FIG. 3 is a view showing one example of ink-jet recording apparatus incorporating a multi-head.

FIG. 3 illustrates an example of an ink-jet recording apparatus in which a muti-head as shown in FIG. 2 is incorporated. In FIG. 3, the blade 61 is a wiping member, one end of which is a fixed end held by a blade-holding member to cantilever. The blade 61 is provided at a position adjacent to a region in which a recording head 65 operates, and in this aspect, is held in such a form that it protrudes into the path of the recording head 65. Reference numeral 62 designates a cap for an ejection opening of the recording head 65, and the cap is arranged in a home position adjacent to the blade 61, moves in the direction perpendicular to the moving direction of the recording head 65, and caps the ink-ejecting opening when touching it.

Numeral 63 designates an ink-absorber provided adjacent to the blade 61, which is held in the moving path of the recording head 65 in a projecting form like the blade 61. The above blade 61, cap 62 and ink-absorber 63 constitute an ejection recovery part 64, and the blade 61 and the ink-absorber 63 serve to remove moisture and dust on the ink-ejecting opening.

Reference numeral 65 designates a recording head. The head contains an energy generating means for ink ejection and performs recording by ejecting ink towards a recording medium opposite to the ink-ejecting opening. Numeral 66 designates a carriage for carrying the recording head 65 to move it. The carriage 66 is engaged with a guide shaft 67 in a slidable manner, and a part of the carriage 66 is connected to a belt 69 (not shown in the figure) driven by a motor 68. Thus the carriage 66 can move along the guide shaft 67, and the recording head 65 can move in the recording region and the region adjacent thereto.

Reference numeral 51 designates a recording medium feeding part for inserting a recording medium and numeral 52 designates a paper-delivery roller driven by a motor not shown in the figure. With such an arrangement, the recording medium is fed to the position opposite to the ink ejecting opening of the recording head 65 and conveyed to a paper output portion provided with a paper output roller 53 as recording proceeds.

In the above arrangement, while the recording head returns to its home position after recording, the cap 62 of the ejection recovery part 64 recedes from the moving path of the recording head, but the blade 61 is projecting in the moving path. As a result, the ink ejecting opening of the recording head 65 is wiped. When the cap 62 comes into contact with the ejection opening face of the recording head 65 to cap it, the cap 62 moves so as to protrude into the path of motion of the recording head 65.

When the recording head 65 is moved from its home position to the position at which recording starts, the cap 62 and the blade 61 are at the same positions as the wiping position as described above. As a result, the ejection opening of the recording head 65 is also wiped at the time of this movement. The above movement of the recording head 65 to its home position is made not only when the recording is completed or for ejection recovery, but also when the recording head 65 is moving in the recording region for recording, that is, it moves to the home position adjacent to the recording region at given intervals during recording, so as to wipe the ejection opening face with this movement.

When color recording is carried by an ink-jet recording apparatus, it may be used a recording head in which ink ejection orifices for cyan, magenta, yellow and black inks are arranged on line. Alternatively, recording heads for respective different color inks may be provided independently. In these cases, each color ink may be ejected from one orifice, or from more than one orifice at the same time so that two or more ink droplets of the same color can be simultaneously attached to a recording medium.

According to the present invention, the recording head is surface treated with an ink repellent treatment material comprised of the above-described epoxy resin composition to have chemical properties shown in Examples described later. Therefore, ink hardly attaches to the head, or attached ink can be removed easily by a cleaning wiper blade. Thus substantial sustenance of printing performance is remarkably enhanced.

Methods for using the epoxy resin composition of this invention will be described below. To cure a film of the epoxy resin composition by irradiation of activation energy rays, the epoxy resin composition contains a triazine-base cationic catalyst as described above.

<Film Forming Method>

In this method, the epoxy resin composition of this invention is used as a coating liquid where the composition is dissolved in a non-polar organic solvent. When a film as thin as several micrometers is formed, the coating liquid can be applied by using a conventional precision coating apparatus such as roll coater, spin coater and spray coater.

A first surface-treating method for treating the surface of a substrate in a pattern is: selectively irradiating the above described film with activation energy rays using a mask having a desired pattern; and then removing the uncured film by treating with a developing solution. Although these basic steps are the same as those of photolithography, it is necessary to select as a developing solution a solvent or a solvent composition suitable for the film of the epoxy resin composition of this invention. As a developing solution, aromatic hydrocarbons, ketones, esters, glycol ethers, and a mixture thereof can be used. To ensure the complete reaction of the above film, desirably the film is heated or further irradiated with activation energy rays after the development.

A second surface treating method comprises the steps of: (1) forming a film on a base material by applying and drying the above coating liquid; (2) curing the formed film by the overall irradiation of activation energy rays that accelerate the polymerization of the film; (3) irradiating the cured film with degrading activation energy rays to remove the desired portion of the cured film. As the activation energy rays that accelerate the polymerization of the film, ultraviolet light rich in light of wavelength between 250 to 480 nm is used. As the degrading activation energy rays, light of a wavelength 210 nm or shorter, that is, excimer laser light can be used. In the above second method, it is also desirable to treat the film with heat or with irradiation of polymerizing activation energy rays in order to complete the curing of the film, in a certain step of the method.

As described above, the epoxy resin composition of this invention is suitably used as a water repellent or water repellent coating to be applied to places that may come in contact with a liquid or substance containing a component that will impair adhesion of water repellent coating, such as polar organic solvents. More specifically, the epoxy resin composition can be used to provide the orifice plate of an ink-jet recording head with water/ink repellency.

EXAMPLES

In the following this invention will be described in further detail with Examples and Comparative Examples. "%" herein used is by weight unless otherwise specified.

The formulation examples of the epoxy resin composition of this invention are shown below. The ratios shown below are based on solid weight. The chemical formula of resin A-1 is described above as a representative resin.

Composition 1
  A-1: 2,4-trichloromethyl-6-(4'-methoxynaphthyl)-s-triazine=96:4 (for use in the following Example 1)

Composition 2
  A-1: 2,4-trichloromethyl-6-piperonyl-s-triazine=94:6 (for use in the following Example 2)

Composition 3
  A-1: 2,4-trichloromethyl-6-piperonyl-s-triazine:1,4-bis(2-hydroxyhexafluoroisopropyl)benzene=95:5:25 (for use in the following Example 3)

Composition 4
  A-1: 2,4-trichloromethyl-6-piperonyl-s-triazine:1,4-bis(2-hydroxyhexafluoroisopropyl)benzene:2,2-bis(4-glycidyloxyphenyl)hexafluoropropane=80:5:25:25 (for use in the following Example 4 described below)

Examples 1 to 4

The compositions 1 to 4 were dissolved respectively in a mixed solvent of Solvesso 100 (a trade name, aromatic hydrocarbon)/Aisoper G (a trade name, aliphatic hydrocarbon) (weight ratio of 1:1) to prepare solutions of a concentration of 30 to 40%. Each solution was applied to the surface of a silicon wafer having a 5 µm thick thermal oxide film to form a film of wet thickness of 1 to 3 µm using a spinner. Then the substrates were dried on a hot plate at 110° C. for 5 minutes to remove the solvent. These 4 substrates were exposed to ultraviolet rays in an integrated amount of 2 J/cm$^2$ by using a UV irradiation apparatus equipped with a high-pressure mercury lamp. The substrates were then heated in an oven at 150° C. for 15 minutes to complete the curing reaction. The following measurements were made on the four substrates thus obtained.

T1: Measurement of Contact Angle

The static contact angle of the cured films of the above substrates was measured by a contact angle meter (trade name: CAX-150; manufactured by Kyowa Kaimen Kagaku Co., Ltd.) using deionized water, 10% aqueous solution of oleic acid, 20% aqueous solution of glycerol, 1% aqueous solution of surfactant (polyoxyethylenenonylphenyl ether; HLB=10) at ordinary temperature.

T2: Measurement of Contact Angle After Immersion in Aqueous Dye Solution (Advancing and Receding Contact Angles)

The above substrates each having a cured film thereon were immersed in a 3% aqueous solution (pH=10.3) of Direct Black 168 (water soluble dye) at 60° C. for 7 days. Then the substrates were washed in deionized water and dried, and the forward and Receding contact angles to the dye solution prepared above were measured with the same contact angle meter as above. The spreading-contracting method was used to measure the contact angle.

T3: Long-Term Printing Durability

Figure 4A:
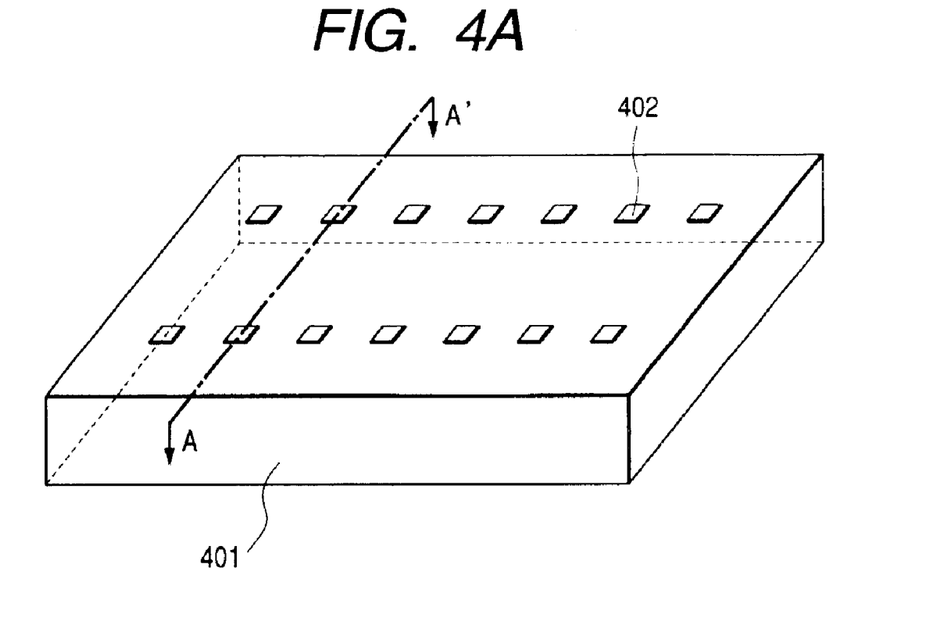
FIGS. 4A, 4B and 4C are block diagrams illustrating the method of this invention.
Figure 4B:
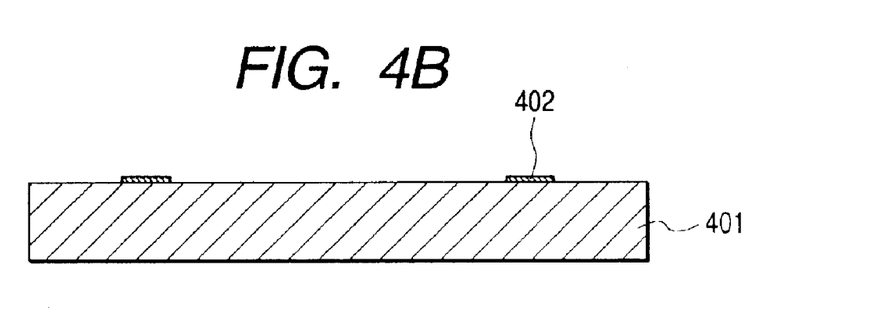
Figure 4C:
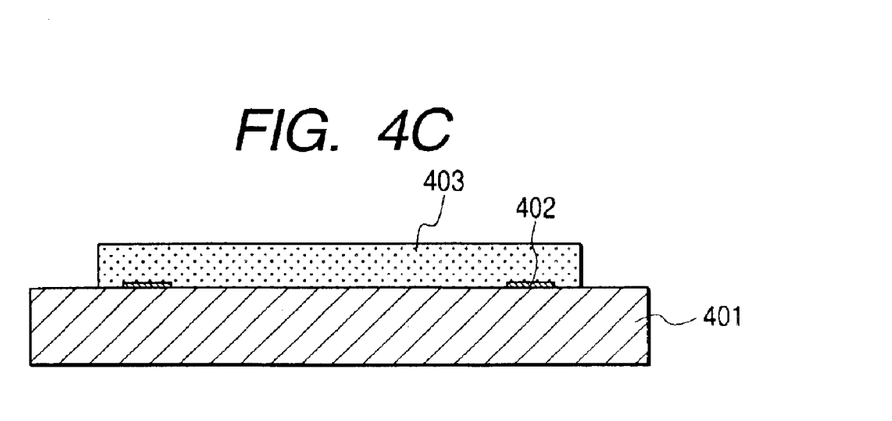

As shown in FIGS. 4A to 5C, substrates 401 on which ejection energy-generating elements 402 were provided in advance were spin coated with a positive resist (trade name ODUR-1010, manufactured by Tokyo Ohka Kogyo Co., Ltd.) to the film thickness of 13 µm to form a resist layer 403 (FIG. 4C). Then onto the resist layer 403 an epoxy resin composition of which formulation is shown in Table 1 was stacked as a flow path forming material 501 to a layer thickness of 25 µm, as shown in FIG. 5A.

TABLE 1

Constitution of Epoxy Resin Composition

| Composition | Part by weight |
|---|---|
| Alicyclic Epoxy Resin (EHPE3150, manufactured by Daicel Chemical Industries, Ltd.) | 95 |
| NUC Silane Coupling Agent A-187 (manufactured by Nippon Unicar Co., Ltd.) | 5 |
| Optomer-SP-170 (manufactured by Asahi Denka Kogyo K.K.) | 2 |
| diethylene glycol dimethyl ether . | 100 |

Figure 5A:
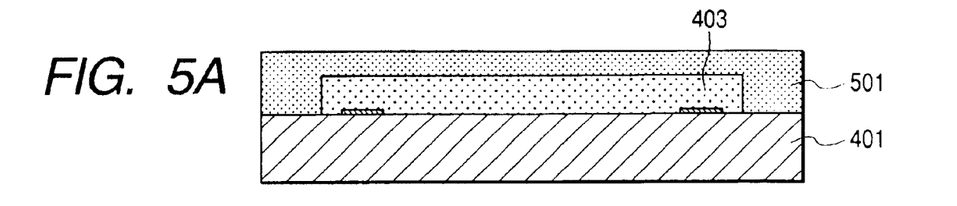
FIGS. 5A, 5B, 5C, 5D and 5E are block diagrams illustrating the method of this invention.
Figure 5B:
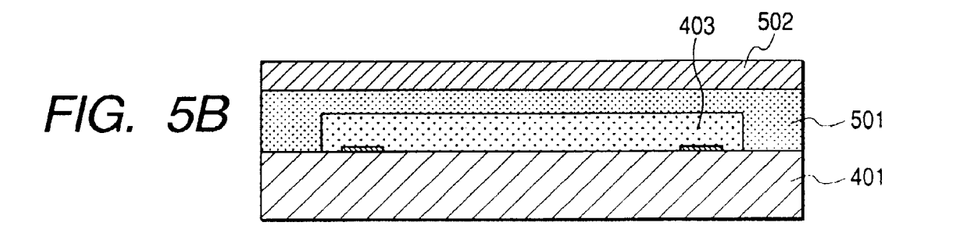
Figure 5C:
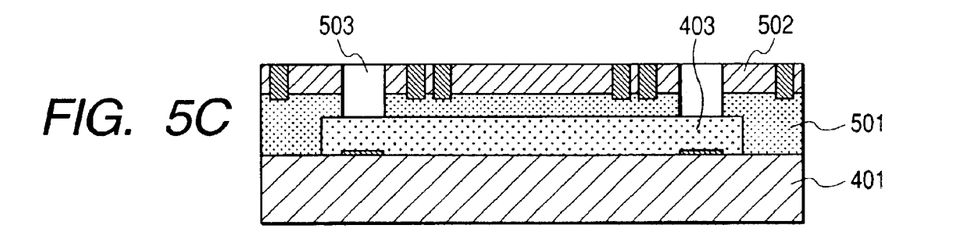
Figure 5D:
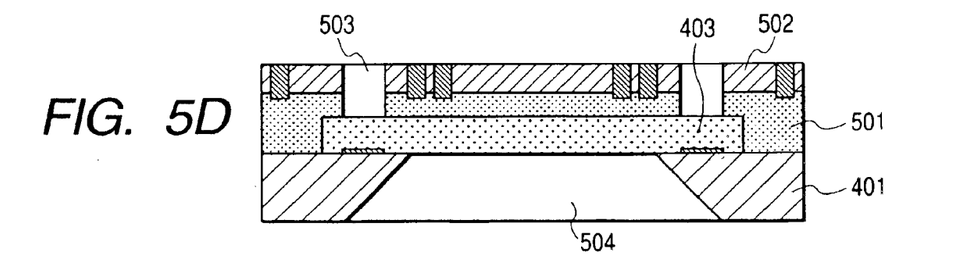
Figure 5E:
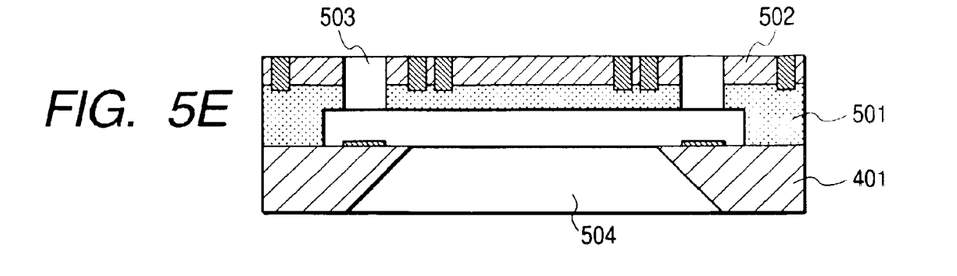

After stacking of the material 501, the substrates were dried on a hot plate at 80° C. for 3 minutes. Then, as shown in FIG. 5B, the products thus obtained were coated with the solutions used in the above Examples 1 to 4 containing the compositions 1 to 4 by spin coating respectively to form a film 502. The first (501) and second (502) photosensitive resin layers thus formed were exposed to ultraviolet rays at 1.0 J/cm$^2$ and heat treated at 90° C. for 4 minutes with Mask Aligner MPA600 manufactured by Canon Inc., and immersed in a developing solution of MIBK/xylene=2/3 to form ejection orifice portions 503 (FIG. 5C). Then the backside of the Si substrate 401 was anisotropically etched to form an ink feeding port 504 as shown in FIG. 5D, and lastly the resist 403 was removed as shown in FIG. 5E and the substrates were heat treated at 200° C. for 1 hour to completely cure the first (501) and second (502) photosensitive resin layers (FIG. 5E). Thus nozzles were completed.

Thus obtained nozzles were incorporated into an ink-jet recording head, which was then electrically wired in a prescribed manner and mounted on a printer to conduct a long-term printing durability test using an ink-jet ink (deionized water:glycerol:Food Black 2 (water soluble black dye):N-methylpyrrolidone=70:15:3:12 (parts by weight).

T3-1

In the printing durability test, a text and a pattern to evaluate the landing accuracy of ink droplets were printed on 100 sheets, and the last printed sheet was evaluated for dot irregularity according to the following criteria.

Grade A: No irregularities were observed in the dot position and the characters were clear;

Grade B: Although there were slight irregularities in the dot position, character print quality was hardly affected;

Grade C: There were considerable irregularities in the dot position and the clarity of the characters deteriorated; and Grade D: There were considerable missing dots and the quality of the characters significantly deteriorated.

T3-2

The surface of the print head used for the durability test was examined to evaluate the amount of ink attached thereto according to the following criteria.

Grade A: Almost no ink droplets were observed on the surface of the nozzles.

Grade B: Small ink droplets were observed on the surface of the nozzles.

Grade C: There were large ink droplets on the area surrounding the ejection orifices of the nozzles.

The results are summarized in Table 2.

Comparative Example 1

Surface treatment was performed in the same manner as in Examples 1 to 4 except that an onium salt of Lewis acid, UVI-6974 (manufactured by UCC), was used as a catalyst and a polar solvent mixture, diethyleneglycol dimethyl ether/butyl acetate=8/2 (weight ratio), was used as a mixed solvent for the epoxy resin composition, and evaluation of T1 to T3 were carried out. The results are shown in Table 2.

TABLE 2

| | Evaluation Results | | | | | | | |
|---|---|---|---|---|---|---|---|---|
| | T1: Contact Angle (°) | | | | T2: Immersion Test Contact Angle (°) | | T3: Long-term Print Durability Test | |
| Composition | Deionized Water | Oleic Acid | Glycerol | Surfactant | Advancing | Receding | T3-1 | T3-2 |
| Example 1 | 96 | 84 | 94 | 89 | 96 | 88 | A | B |
| Example 2 | 102 | 89 | 99 | 84 | 103 | 89 | A | A |
| Example 3 | 103 | 93 | 103 | 88 | 105 | 85 | B | A |
| Example 4 | 104 | 96 | 107 | 91 | 108 | 91 | A | A |
| Comparative Example 1 | 88 | 72 | 87 | 80 | 91 | 74 | C | C |

As shown in Table 2, the films consisting of the epoxy resin composition of this invention keep high contact angles, the ink would not attach to the orifice plate of the head coated with the film even after long-term contact, dot accuracy is kept high and print quality is maintained for a long time.

Example 5

Polyether sulfone plates were coated with the water repellents 1 to 3 used in Examples 1 to 3 by spinner coating and dried. The film thickness after evaporation of the solvent was about 2 μm. These substrates were irradiated with light from a high-pressure mercury lamp in total 10 J/cm² for polymerization setting of the film. Then the substrates were irradiated from above with excimer laser whose beam diameter was converged to 5 μm and whose wavelength was 195 nm to form nozzles in the substrates. Perforation was satisfactorily done and little degradation debris was observed at the edge portions; thus, processed conditions were good. This indicates that the epoxy resin composition of this invention is suitable for UV laser processing.

Comparative Example 2

A formed polyether sulfone plate was coated with the water repellent of Comparative Example 1 by spinner coating. The film thickness after solvent evaporation was about 2 μm. The substrate was irradiated with light from a high-pressure mercury lamp in total 10 J/cm² for film polymerization. Then the substrate was irradiated from above with excimer laser of which beam diameter was converged to 5 μm and wavelength was 195 nm to form nozzles in the substrate. The perforation was not satisfactory, and the surface profile was not uniform. Analysis showed that the cause was presumably polyether sulfone dissolved with the polar solvent contained in the water repellent.

As described so far, according to this invention, provided is an epoxy resin composition which can be suitably used as a water repellent or a water repellent coating to be applied to a place tht may come in contact with solutions or substances containing a component that impairs the film forming properties and adhesiveness of conventional water repellents. Further, according to this invention, provided is an epoxy resin composition capable of accomplishing surface modification treatment to keep the same surface conditions.

Further, according to this invention, are provided an ink-jet recording head and an ink-jet recording apparatus of which orifice plate conditions can be always kept the same and their print head has no ink attached on its surface even after the long-term contact with the recording medium since their base materials are surface treated with the above epoxy resin composition, as a result, of which dots' impact accuracy is highly improved and print quality can be kept high for a long time.

What is claimed is:

1. An epoxy resin composition comprising:

an epoxy resin having one or more water repellent groups and two or more cyclic aliphatic epoxy groups per molecule;

a triazine-base catalyst for cationic polymerization; and a non-polar solvent, wherein the epoxy resin has the following general formula (1):

wherein $R_1$, $R_4$ and $R_5$ are independently selected from a hydrogen atom and an alkyl group with 1 to 3 carbons; $R_2$ and $R_3$ are independently selected from a methyl group and a phenyl group; x is 2 to 100; $n_1$ is an integer of 1 to 3; $n_2$ is an integer of 1 to 5; Rf is a fluoroalkyl group; a is 1 to 50; b is 2 to 100; c is 1 to 50; and d is 1 to 50, the number average molecular weight being 8,000 to 22,000.

2. The epoxy resin composition according to claim 1, wherein the non-polar solvent is an aromatic hydrocarbon or an aliphatic hydrocarbon or both.

3. The epoxy resin composition according to claim 1, wherein the triazine-base catalyst for cationic polymerization is at least one selected from the group consisting of:

(i) 2,4-trichloromethyl-6-(4'-methoxyphenyl)-s-triazine;

(ii) 2,4-trichloromethyl-6-(4'-methoxynaphthyl)-s-triazine;

(iii) 2,4-trichloromethyl-6-piperonyl-s-triazine;

(iv) 2,4-trichloromethyl-6-(4'-methoxystyryl)-s-triazine; and (v) 2,4-trichloromethyl-6-(3'-bromo-4'-methoxyphenyl)-s-triazine.

4. The epoxy resin composition according to claim 3, wherein the triazine-base catalyst for cationic polymerization is 2,4-trichloromethyl-6-piperonyl-s-triazine.

5. The epoxy resin composition according to claim 1, further comprising a compound selected from the group consisting of compounds having the following general formulae (2) and (3):

wherein p is an integer of 0 to 2;

-continued (3)

wherein q is an integer of 0 to 2, and

6. A method for selectively treating a surface of an object comprising the steps of:
   (i) forming a film of an epoxy resin composition of claim 1 on the surface of an object;
   (ii) irradiating the film with activation energy rays through a mask having a pattern; and
   (iii) dissolving and removing a portion of the film not exposed to the activation energy rays with a liquid capable of dissolving such a portion.

7. A method for selectively treating a surface of an object comprising the steps of:
   (i) forming a film of an epoxy resin composition of claim 1 on the surface of an object;
   (ii) setting the film by polymerization; and
   (iii) selectively removing the film.

8. An ink-jet recording head comprising an ejection orifice for ejecting a liquid therethrough surrounded by an area coated with a cured film of an epoxy resin composition of claim 1.

9. An ink-jet recording apparatus comprising an ink-jet recording head of claim 8.

* * * * *